United States Patent
Su

(10) Patent No.: US 9,350,297 B2
(45) Date of Patent: May 24, 2016

(54) ACTIVE MIXER AND ACTIVE MIXING METHOD

(71) Applicant: REALTEK SEMICONDUCTOR CORPORATION, Hsinchu (TW)

(72) Inventor: Hsuan-Yi Su, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/581,025

(22) Filed: Dec. 23, 2014

(65) Prior Publication Data
US 2015/0188494 A1 Jul. 2, 2015

(30) Foreign Application Priority Data

Dec. 27, 2013 (TW) ................. 102148911 A

(51) Int. Cl.
*G06G 7/12* (2006.01)
*H03D 7/14* (2006.01)

(52) U.S. Cl.
CPC ........... *H03D 7/1441* (2013.01); *H03D 7/1458* (2013.01); *H03D 7/1491* (2013.01)

(58) Field of Classification Search
CPC ... H03D 7/1485; H03D 7/1435; H03D 7/125; H03D 7/1428; G06G 7/14
USPC ........................................................ 327/355
See application file for complete search history.

(56) References Cited

U.S. PATENT DOCUMENTS

| | | | |
|---|---|---|---|
| 5,548,840 A | 8/1996 | Heck | |
| 6,078,802 A | 6/2000 | Kobayashi | |
| 6,639,447 B2 | 10/2003 | Manku et al. | |
| 7,417,486 B2 * | 8/2008 | Koutani | H03D 7/1433 327/103 |
| 7,816,970 B2 | 10/2010 | Kim | |
| 7,948,294 B2 | 5/2011 | Wu | |
| 8,571,510 B2 * | 10/2013 | Liu | H03F 1/32 455/293 |

FOREIGN PATENT DOCUMENTS

TW 200913462 3/2009

OTHER PUBLICATIONS

Office Action for the counterpart Taiwan application 102148911 dated Oct. 23, 2015.

(Continued)

*Primary Examiner* — Lincoln Donovan
*Assistant Examiner* — Diana J Cheng
(74) *Attorney, Agent, or Firm* — WPAT, P.C., Intellectual Property Attorneys; Anthony King

(57) ABSTRACT

The present disclosure discloses an active mixer capable of improving linearity while giving consideration to both gain and noise reduction, including: a voltage-to-current converting circuit operable to generate a conversion signal according to an input signal; a switching circuit operable to carry out a switching action according to a clock signal and thereby electrically connect the voltage-to-current converting circuit with a load circuit; the load circuit operable to provide an output signal for a first and a second output nodes according to the conversion signal through the switching action; a first supplement current source, coupled to a first node between the switching circuit and the first output node, operable to supply a first supplemental current to the switching circuit; and a second supplement current source, coupled to a second node between the switching circuit and the second output node, operable to supply a second supplemental current to the switching circuit.

20 Claims, 3 Drawing Sheets

(56) References Cited

OTHER PUBLICATIONS

The corresponding search report for the counterpart Taiwan application 102148911 dated Oct. 23, 2015.
English abstract translation of the Office Action for the counterpart Taiwan application 102148911 dated Oct. 23, 2015.
Xu, Qiming et al., A direct-conversion mixer with DC-offset cancellation for IEEE 802.11a WLAN receiver, ISCAS 2006.
Laferriere, Paul et. al., A 5 GHz direct-conversion receiver with DC offset correction, ISCAS 2004.
MacEachern, Leonard A. et al., A charge-injection method for Gilbert cell biasing, IEEE, 1998.

* cited by examiner

ACTIVE MIXER AND ACTIVE MIXING METHOD

BACKGROUND OF THE INVENTION

1. Field of the Invention

The present disclosure relates to a mixer and a mixing method, especially to an active mixer and an active mixing method.

2. Description of Related Art

A mixer is operable to convert the frequency of an input signal, and the conversion is usually carried out through a switching circuit to multiply the input signal by a switching signal. The input signal to a mixer includes a radio-frequency signal and a local oscillation signal, while the output signal from the mixer is an intermediate-frequency signal which is generated by performing a frequency-shift operation to the radio-frequency signal in accordance with the local oscillation signal. Normally, a mixer is applicable to a frequency up-conversion circuit in a transmitting system or a frequency down-conversion circuit in a receiving system, and the mixer could be a passive mixer or an active mixer. Compared with an active mixer, a passive mixer has a better characteristic of linearity, but is unable to provide a conversion gain; therefore, as for a system adopting a passive mixer, the front-end circuit in the system has to provide a higher gain to suppress the noise generated by the rear-end circuit in the system; in addition, the isolation between the oscillation signal and the radio-frequency signal in a passive mixer is relatively worse, which possibly causes the problem of radiation of the oscillation signal. On the other hand, an active mixer is operable to convert a radio-frequency voltage into a current during its transistors operating in a saturation region, and carry out the frequency conversion with its switching circuit by outputting the current according to a switching signal; afterwards, the current outputted from the switching circuit is turned into an output voltage through an output load such that the active mixer is able to provide a conversion gain. Compared with a passive mixer, an active mixer provides a better effect on noise reduction due to its conversion gain; but the configuration of an active mixer has to distribute a voltage among a voltage-to-current converting circuit, a switching circuit and a load circuit under the supply limitations of the voltage, and reserve an appropriate margin of signal swing for each of the circuits for proper operation such that the design for an active mixer is relatively critical and the linearity is worse. More specifically, there must be some give and take in the design of an active mixer. Take a double-balanced active mixer (a.k.a. Gilbert Cell) for example; although it is able to reduce flicker noise by reducing the current flowing through a transistor (hereafter, switching transistor) for receiving a local oscillation signal, this manner leads to the increase of the effective impedance seen by another transistor (hereafter, input transistor) for receiving a radio-frequency signal, and, consequently, the input transistor is likely to enter a triode region from a saturation region when receiving the radio-frequency signal of a higher amplitude and then degrade the linearity of the active mixer. In addition, although it is possible to raise the gain by increasing the load resistance at the output end for the intermediate-frequency signal of the active mixer, this manner similarly decreases the current flowing through the switching transistor and degrades the linearity of the active mixer. In addition to the above-mentioned problems, as the development of semiconductor processes improves, the maximum operation voltage available to a miniaturized transistor is gradually decreased. Accordingly, if the first concern is to make sure that the switching and input transistors operate in the saturation region to keep the linearity (which means that the linearity concern dominates), the margin of signal swing at the output end of the intermediate-frequency signal is sacrificed (which means that the conversion gain is sacrificed), which is unfavorable to the following signal processing procedure; but if the first concern is to ensure the margin of signal swing at the output end, the probability of the switching and input transistors entering the triode region from the saturation region increase, which leads to the loss in the linearity of the active mixer. In order to solve the problems due to the lower and lower operation voltage, some prior arts make use of source-degeneration techniques for the improvement; however, the source de-generation techniques leads to the reduction in gain and the increase in circuit area, which also leaves a designer the dilemma.

People who are interested in the prior arts may refer to the following documents: US patent application of publication number 20090029668; and U.S. Pat. Nos. 5,548,840, 6,078,802, 6,639,447, 7,816,970, 7,948,294.

SUMMARY OF THE INVENTION

In view of the problems of the prior arts, the present disclosure provides an active mixer and an active mixing method capable of improving the prior arts.

The present disclosure discloses an active mixer capable of improving linearity while giving consideration to gain and noise reduction. An embodiment of the active mixer includes: a voltage-to-current converting circuit operable to generate a conversion signal according to an input signal; a switching circuit, coupled with the voltage-to-current converting circuit, operable to carry out a switching action according to a clock signal and thereby electrically connect the voltage-to-current converting circuit with a load circuit; the load circuit operable to provide an output signal for a first output node and a second output node according to the conversion signal through the switching action; a first supplement current source, coupled to a first node between the switching circuit and the first output node, operable to supply a first supplemental current to the switching circuit; and a second supplement current source, coupled to a second node between the switching circuit and the second output node, operable to supply a second supplemental current to the switching circuit.

The present disclosure also discloses an active mixing method capable of taking gain, noise reduction and linearity into consideration simultaneously. An embodiment of this method is carried out by an active mixer including a voltage-to-current converting circuit, a switching circuit and a load circuit, and includes the following steps: generating a conversion signal according to an input signal by the voltage-to-current converting circuit; carrying out a switching action according to a clock signal by the switching circuit and thereby electrically connecting the voltage-to-current converting circuit with the load circuit through the switching action; providing an output signal for a first output node and a second output node which are located between the switching circuit and the load circuit according to the conversion signal through the switching action; supplying a first supplemental current to the switching circuit through a first node which is located between the first output node and the switching circuit; and supplying a second supplemental current to the switching circuit through a second node which is located between the second output node and the switching circuit.

These and other objectives of the present disclosure no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this technical field. If any term is defined in this specification, such term should be explained accordingly. In addition, the connection between objects or events in the disclosed embodiments can be direct or indirect provided that these embodiments are still practicable under such connection. Said "indirect" means that an intermediate object or a physical space is existed between the objects, or an intermediate event or a time interval is existed between the events.

The present disclosure discloses an active mixer and an active mixing method capable of improving linearity while giving consideration to both of gain and noise reduction. The mixer and mixing method are applicable to an integrated circuit (e.g. a communication IC) or a system device (e.g. a stationary or portable communication device). Provided that an alternative means is available and reasonable, people of ordinary skill in the art can use such means similar or equivalent to those described in this specification to carry out the present disclosure, which implies that the scope of this disclosure is not limited to the embodiments in this specification. On account of that some element of the mixer of the present disclosure could be known, the detail of such element is omitted as long as this omission nowhere dissatisfies the specification and enablement requirements. In addition, the mixing method can be in the form of firmware and/or software which could be carried out by the mixer of this disclosure or the equivalent thereof; therefore, provided that the remaining disclosure is still enough for understanding and enablement, the following description abridges the hardware details for carrying out the method, but put the emphasis on the steps.

Figure 1:
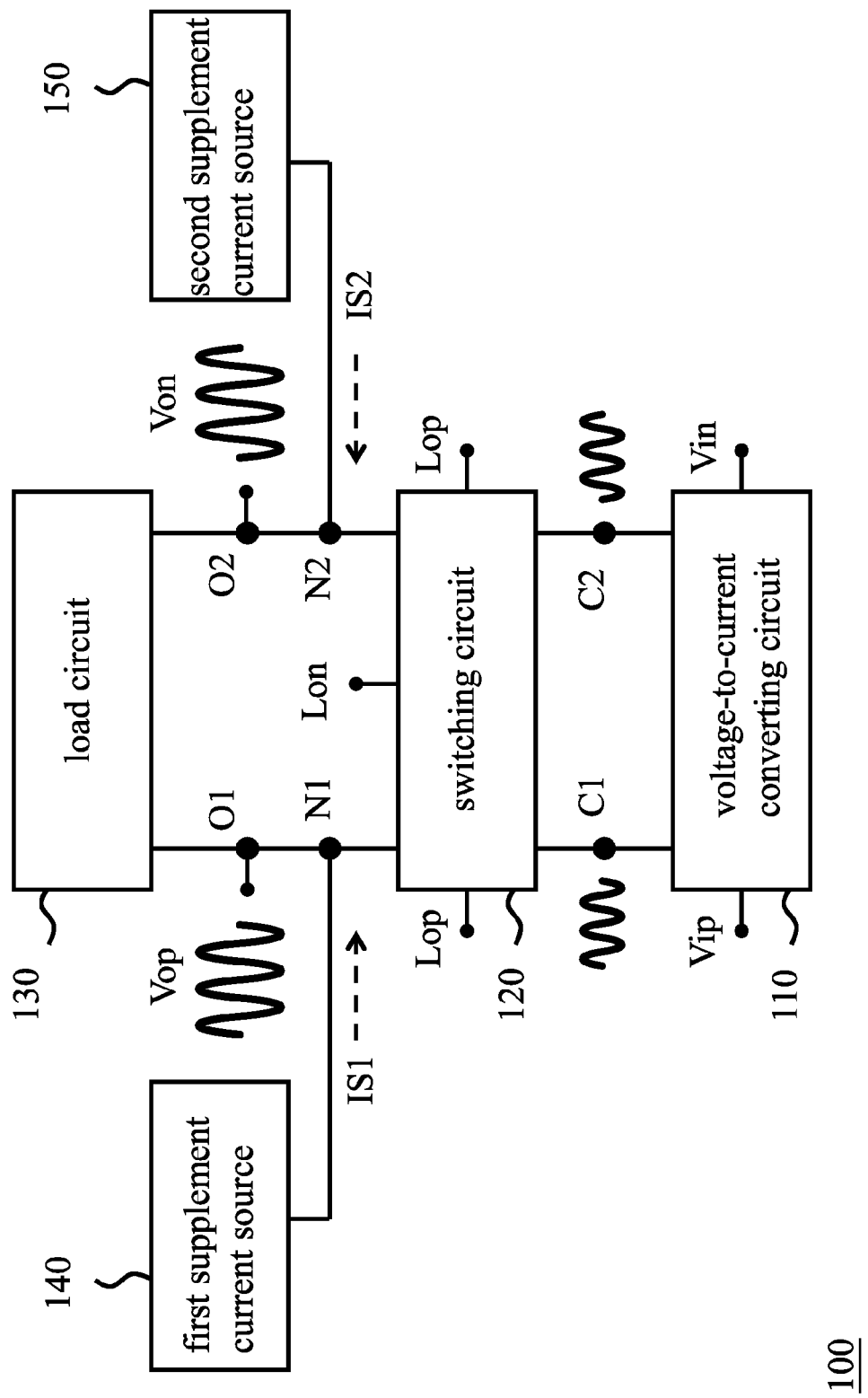
FIG. 1 illustrates an embodiment of the active mixer of the present disclosure.

Referring to FIG. 1, an embodiment of the active mixer of the present disclosure is presented. As it is shown in FIG. 1, the active mixer 100 of this embodiment comprises: a voltage-to-current converting circuit 110, a switching circuit 120, a load circuit 130, a first supplement current source 140 and a second supplement current source 150. Said voltage-to-current converting circuit 110 could be a transconductance amplifier or its equivalent in function, and operable to generate a conversion signal according to an input signal. Said switching circuit 120 is coupled with the voltage-to-current converting circuit 110, and operable to carry out a switching action in accordance with a clock signal (equal to or derived from an oscillation signal) and thereby connect the voltage-to-current converting circuit 110 with the load circuit 130 through the switching action. Said load circuit 130 is coupled with the switching circuit 120, and operable to form an output signal at a first output node O1 and a second output node O2 according to the conversion signal from the voltage-to-current converting circuit 110 through the switching action of the switching circuit 120. Said first supplement current source 140 is coupled with a first node N1 located between the switching circuit 120 and the first output node O1, and operable to provide a first supplemental current IS1 for the switching circuit 120, so as to ensure the amount of the current flowing through the switching circuit 120 when the impedance of the load circuit 130 is unchanged or increased, which thereby improves the linearity of the mixer 100. Similarly, said second supplement current source 150 is coupled with a first node N2 located between the switching circuit 120 and the second output node O2, and operable to provide a second supplemental current IS2 for the switching circuit 120 so as to improve the linearity while the impedance of the load circuit 130 is kept the same or increased.

Figure 2:
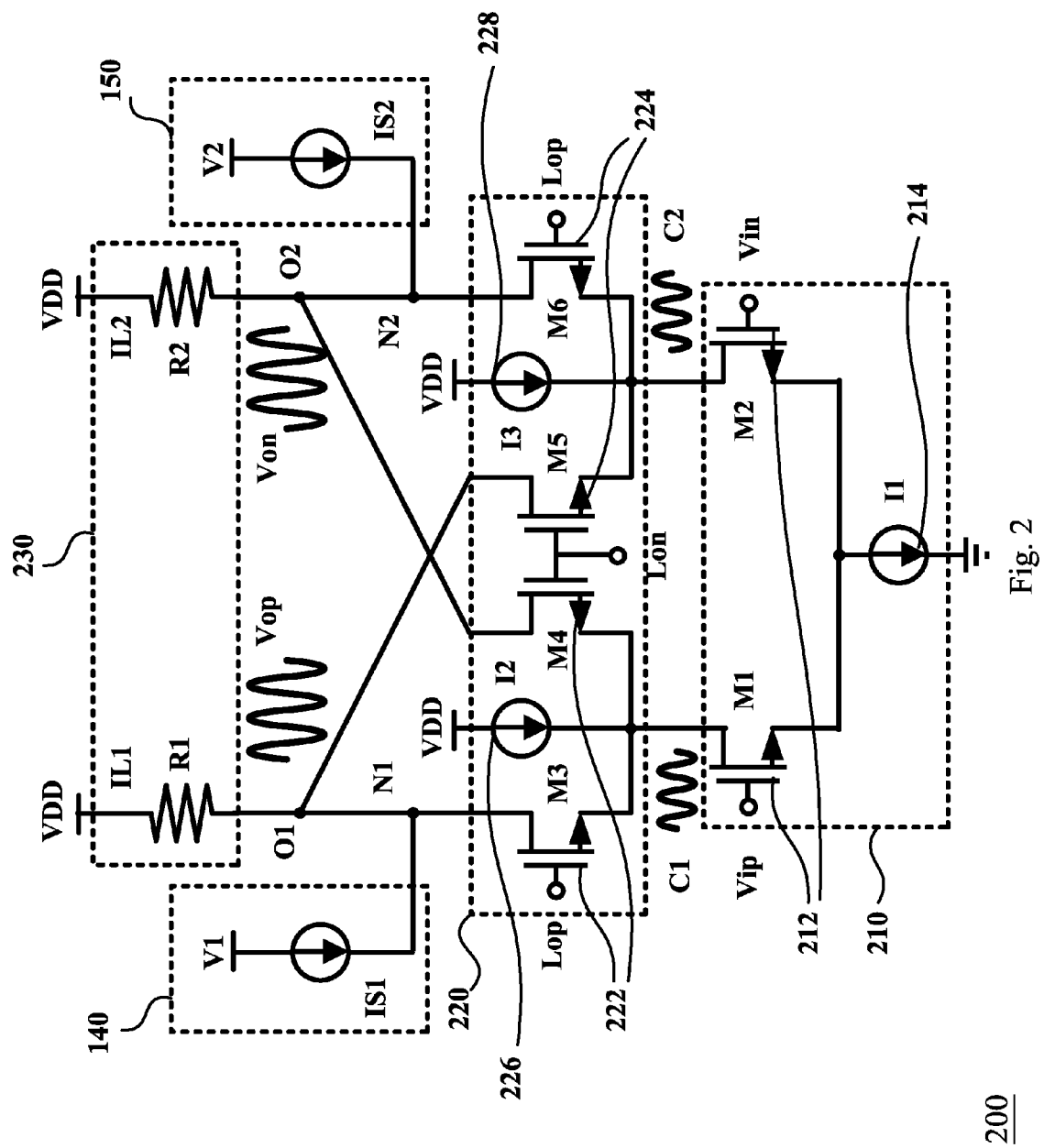
FIG. 2 illustrates an exemplary implementation of the active mixer in FIG. 1.

Referring to FIG. 2, an exemplary implementation of the active mixer 100 in FIG. 1 is presented. In this implementation, the active mixer 200 is derived from the configuration of a double-balanced active mixer and treated as a frequency down-converter, and the aforementioned input signal here is a radio-frequency signal while the output signal is an intermediate-frequency signal; however, this implementation is merely taken for example, and those of ordinary skill in the art can make use of a known or self-designed mixer configuration to implement the converting circuit 110, the switching circuit 120 and the load circuit 130 in FIG. 1, which implies that the configuration in FIG. 2 is not a limitation to the scope of the present disclosure. As it is shown in FIG. 2, the voltage-to-current converting circuit 210 includes a first differential transistor pair 212 and a first current source 214; the first transistor pair 212 includes a first transistor M1 and a second transistor M2 in which the transistor M1 is operable to generate a first-phase signal C1 of the aforementioned conversion signal according to the signal Vip of the input signal while the transistor M2 is operable to generate a second-phase signal C2 of the conversion signal according to the signal Vin (e.g. the reversed signal of the signal Vip) of the input signal; and the first current source 214 is coupled to a node between the first differential transistor pair 212 and a grounding end, and operable to determine the amount of the current I1 flowing through the first differential transistor pair 212.

Referring to FIG. 2 again, the switching circuit 220 includes a second differential transistor pair 222 (including transistors M3, M4), a third differential transistor pair 224 (including transistors M5, M6), a second current source 226 and a third current source 228 in which the second and third differential transistor pairs 222, 224 are cross-coupled with each other. The switching circuit 220 is operable to carry out the switching action according to the aforementioned clock signal; the transistor M3 therein is coupled with the aforementioned first supplement current source 140 and the first output node O1 to receive the current IL1 from the load circuit 230 and the first supplemental current IS1, and operable to execute the switching action according to the signal Lop of the clock signal (including a DC component Lop_dc and an AC component Lop_ac); the transistor M4 is coupled with the second supplement current source 150 and the second output node O2 to receive the current IL2 from the load circuit 230 and the second supplemental current IS2, and operable to execute the switching action according to the signal Lon (e.g. the reversed signal of the signal Lon) of the clock signal (including a DC component Lon_dc and an AC component Lon_ac); the transistor M5 is coupled with the first supplement current source 140 and the first output node O1 to receive the current IL1 from the load circuit 230 and the first supplemental current IS1, and operable to execute the switching action in accordance with the signal Lon of the clock signal; and the transistor M6 is coupled with the second supplement current source 150 and the second output node O2 to receive the current IL2 from the load circuit 230 and the second supplemental current IS2, and operable to execute the switching action in accordance with the signal Lop of the clock signal. Provided that the circuit design of the mixer 200 in FIG. 2 is symmetric and the clock signals Lop, Lon are respectively equivalent to the DC components Lop_dc, Lon_dc to thereby make the conducting statuses of the transistors M3 through M6 identical, in order to reduce the flick noise of the second differential transistor pair 222 and third differential transistor pair 224, the second current source 226 provides the current I2 for the transistor M1 (in which I2<(I1/2)) under a state that the amount of the current flowing through the transistor M1 remains unchanged, so as to reduce the amount of the current flowing through/outputted from the transistor M3 (i.e. (IL1+IS1)/2={[(I1/2)−I2]}/2) of the second differential transistor pair 222 and the amount of the current flowing through/outputted from the transistor M4 (i.e. (IL2+IS2)/2={[(I1/2)−(I2]}/2) of the second differential transistor pair 222, and thus decrease the flicker noise, wherein the current I2 and the supplemental currents IS1, IS2 can be dependent on each other (that is to say complementary or linked) through appropriate design to prevent the currents IL1, IL2 from the load circuit 230 from being reduced or overly reduced due to the provision of the current I2, which therefore prevents the margin of swing of the output signal from being affected and avoids the influence on the signal gain. Similarly, the third current source 228 provides the current I3 for the transistor M2 (in which I3<(I1/2)) under a state that the amount of the current flowing through the transistor M2 remains unchanged, so as to reduce the amount of the current flowing through/outputted from the transistor M5 (i.e. (IL1+IS1)/2=[(I1/2)−I3]/2) of the third differential transistor pair 224 and the amount of the current flowing through/outputted from the transistor M6 (i.e. (IL2+IS2)/2=[(I1/2)−I3]/2) of the third differential transistor pair 224, and thus decrease the flicker noise. Furthermore, the current I3 and the supplemental currents IS1, IS2 can be dependent on each other through appropriate design to prevent the currents IL1, IL2 from the load circuit 230 from being reduced or overly reduced due to the provision of the current I3, and thereby keep the level of the signal gain. Please note that the above description is derived under a state that the transistors M3 through M6 stay in the same conducting statuses; however, as the relationship between the clock signal Lop and the clock signal Lon varies (e.g. Lop=Lop_dc+Lop_ac(max), Lon=Lon_dc+Lon_ac(min)), the currents respectively flowing through the transistors M3, M4 may be different but complementary to provide the current [(I1/2)−I2] together, and the currents respectively flowing through the transistors M5, M6 may be different but complementary to provide the current [(I1/2)−I3]. Since the relationship between the clock signals Lop, Lon and the linked conducting statuses of the transistors M3 through M6 are well known in this technical field, repeated and redundant explanation is therefore omitted.

Referring to FIG. 2 again, the load circuit 230 includes resistors R1, R2, in which the resistor R1 is coupled between a working voltage VDD and the first output node O1 and operable to form the signal Vop of the output signal according to the first-phase signal C1 of the aforementioned conversion signal while the resistor R2 is coupled between the working voltage VDD and the second output node O2 and operable to provide/form the signal Von (e.g. the reversed signal of the signal Vop) of the output signal according to the second-phase signal C2 of the conversion signal. In addition, the first supplement current source 140 is coupled between a first voltage V1 and the aforementioned first node N1 and operable to provide the first supplemental current IS1 in accordance with the first voltage V1; more specifically, the amount of the first supplemental current IS1 is determined according to at least one of the voltage at the first node N1 and the current flowing through the switching circuit 220 (i.e. the transistors M3, M5). Similarly, the second supplement current source 150 is coupled between a second voltage V2 and the aforementioned second node N2 and operable to provide the second supplemental current IS2 in accordance with the second voltage V2 in which the amount of the second supplemental current IS2 is determined according to at least one of the voltage at the second node N2 and the current flowing through the switching circuit 220 (i.e. the transistors M4, M6). In this exemplary implementation, each of the said first voltage V1 and second voltage V2 is higher than the working voltage VDD. For instance, each of the first voltage V1 and second voltage V2 is higher than or equal to the sum of the working voltage VDD and a threshold voltage Vsat of the switching circuit 220 under a transistor saturation mode; more specifically, the first voltage V1 is higher than the sum of the working voltage VDD and the threshold voltage Vsat of the transistor M3 or M5 under its saturation mode, and the second voltage V2 is higher than the sum of the working voltage VDD and the threshold voltage Vsat of the transistor M6 or M4 under its saturation mode. Additionally, the second current source 226 and the third current source 228 in this implementation operate in accordance with the working voltage VDD, but people of ordinary skill in the art may make some alterations in this; for instance, the second current source 226 may work in light of a third voltage while the third current source 228 may work in light of a fourth voltage in which the third and fourth voltages are lower than the operating voltages of the first and second supplement current sources 140, 150 (i.e. the aforementioned voltages V1, V2).

In some embodiments, the voltage V1 is equivalent to the voltage V2.

Please note that in the exemplary implementation of FIG. 2, the circuit design is in the form of symmetry, so that the supplemental current IS1 is equivalent/complementary to the supplemental current IS2, the current IL1 is equivalent/complementary to the current IL2, the current I2 is equivalent/complementary to the current I3, and the voltage V1 is equivalent/complementary to the voltage V2. Please further note that the generation or provision of the said current or voltage is carried out during circuit operation; since those of ordinary skill in the art can fully appreciate the difference between a circuit operation state and a circuit non-operation state, unnecessary explanation is therefore omitted. Please further note that although the transistors in FIG. 2 are NMOS transistors, people of ordinary skill in the art may choose other appropriate types of transistor to carry out the circuit in FIG. 2 or its equivalent as long as this circuit is still practicable.

Figure 3:
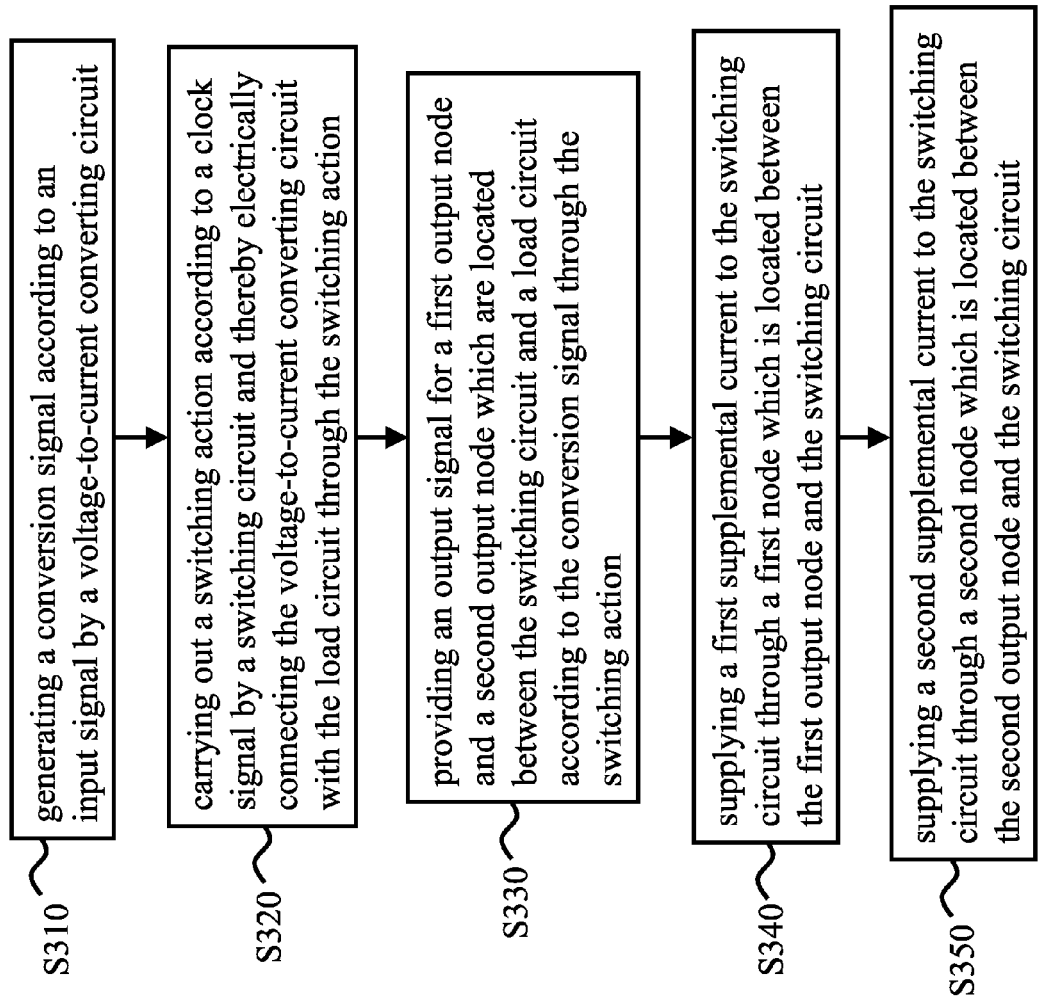
FIG. 3 illustrates an embodiment of the active mixing method of the present disclosure.

In addition to the fore-disclosed device, the present disclosure also discloses an active mixing method which is executed by an active mixer including a voltage-to-current converting circuit, a switching circuit and a load circuit. Said active mixer could be the mixer of the present disclosure or the equivalent thereof. As it is shown in FIG. 3, an embodiment of the active mixing method of the present disclosure comprises the following steps:

Step S310: generating a conversion signal according to an input signal by a voltage-to-current converting circuit. This step could be carried out by the voltage-to-current converting circuit 110 in FIG. 1 or the equivalent thereof.

Step S320: carrying out a switching action according to a clock signal by a switching circuit and thereby electrically connecting the voltage-to-current converting circuit with the load circuit through the switching action. This step could be carried out by the switching circuit 120 in FIG. 1 or its equivalent.

Step S330: providing an output signal for a first output node and a second output node which are located between the switching circuit and a load circuit according to the conversion signal through the switching action. This step could be carried out by the load circuit 130 in FIG. 1 or its equivalent.

Step S340: supplying a first supplemental current to the switching circuit through a first node which is located between the first output node and the switching circuit. This step could be carried out by the first supplement current source 140 in FIG. 1 or the equivalent thereof.

Step S350: supplying a second supplemental current to the switching circuit through a second node which is located between the second output node and the switching circuit. This step could be carried out by the second supplement current source 150 or the equivalent thereof.

On the basis of the above description, in this embodiment, the step S330 may further include: providing the output signal according to the working voltage of the load circuit; the step S340 may further include: generating the first supplemental current according to a first voltage; and the step S350 may further include: generating the second supplemental current according to a second voltage. Both the first and second voltages here are higher than the working voltage of the load circuit; for instance, each of the first and second voltages is higher than or equal to the sum of the working voltage and a threshold voltage of the switching circuit under a transistor saturation mode. In addition, the first and second voltages are equivalent while the first and second supplemental currents are equivalent under a symmetric circuit design. Furthermore, the amount of the first supplemental current could be determined by at least one of the voltage of the aforementioned first node and the current flowing through the switching circuit; similarly, the amount of the second supplemental current could be determined by at least one of the voltage of the aforementioned second node and the current flowing through the switching circuit. Moreover, the present embodiment may further comprise the following steps: providing a second current (e.g. the current I2 in FIG. 2) and a third current (e.g. the current I3 in FIG. 2) for the aforementioned voltage-to-current converting circuit, so as to reduce the current flowing through the switching circuit; in the meantime, the first supplemental current, the second supplemental current, the second current and the third current are dependent on each other (i.e. complementary or linked).

Since those of ordinary skill in the art can appreciate the implementation detail and the modification thereof of the method by referring to the fore-illustrated device, repeated and redundant description is therefore omitted provided that the remaining disclosure is still enough for understanding and enablement. Please note that in the above description, the language term such as "reversed" indicates relative relation rather than absolute relation. In addition, in the above disclosure, the actual value, type or scale of voltage, current, resistor and transistor could be determined by people of ordinary skill in the art in light of this specification and the common knowledge in this field, and thus unnecessary explanation is omitted. Furthermore, the shape, size, and ratio of any element and the step sequence of any flow chart in the figures are just exemplary for understanding, not for limiting the scope of this disclosure. Moreover, each embodiment in the foregoing description includes one or more features; however, this doesn't mean that one carrying out the present disclosure should make use of all the features of one embodiment at the same time, or should only carry out different embodiments separately. In other words, if an implementation derived from one or more of the embodiments is practicable, a person of ordinary skill in the art can selectively make use of some or all of the features in one embodiment or selectively make use of the combination of some or all features in several embodiments to have the implementation come true, so as to increase the flexibility of carrying out the present disclosure.

Based on those mentioned above, the active mixer and mixing method are operable to improve the characteristic of mixer linearity by providing supplemental currents while giving consideration to the requirements of gain and noise reduction, and can be carried out by an unsophisticated circuit.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An active mixer, comprising:
   a voltage-to-current converting circuit operable to generate a conversion signal according to an input signal;
   a switching circuit, coupled with the voltage-to-current converting circuit, operable to carry out a switching action according to a clock signal and thereby electrically connect the voltage-to-current converting circuit with a load circuit;
   the load circuit operable to provide an output signal for a first output node and a second output node according to the conversion signal through the switching action;
   a first supplement current source, coupled between a first voltage and a first node between the switching circuit and the first output node, operable to supply a first supplemental current to the switching circuit; and
   a second supplement current source, coupled between a second voltage and a second node between the switching circuit and the second output node, operable to supply a second supplemental current to the switching circuit,
   each of the first and second voltages is higher than a working voltage of the load circuit.

2. The active mixer of claim 1, wherein the load circuit is coupled between a node of the working voltage and the switching circuit during operation, the first supplement current source provides the first supplemental current according to the first voltage during operation, the second supplement current source provides the second supplemental current according to the second voltage during operation.

3. The active mixer of claim 2, wherein the first and second voltages are equivalent while the first and second supplemental currents are equivalent.

4. The active mixer of claim 2, wherein each of the first and second voltages is higher than or equal to the sum of the working voltage and a threshold voltage of the switching circuit under a transistor saturation mode.

5. The active mixer of claim 2, wherein the voltage-to-current converting circuit comprises:
   a first differential transistor pair including a first transistor and a second transistor, in which the first transistor is operable to generate a first-phase signal of the conversion signal according to the input signal while the second transistor is operable to generate a second-phase signal of the conversion signal according to the input signal; and
   at least one first current source, coupled between the first differential transistor pair and a grounding end, operable to determine an amount of current flowing through the first differential transistor pair.

6. The active mixer of claim 2, wherein the switching circuit includes:
a second differential transistor pair, coupled with the first and second supplement current sources and the first and second output nodes, operable to carry out the switching action according to the clock signal;
a third differential transistor pair, coupled with the first and second supplement current sources and the first and second output nodes, operable to carry out the switching action according to the clock signal;
a second current source, coupled with the second differential transistor pair, operable to reduce an amount of the current flowing through the second differential transistor pair; and
a third current source, coupled with the third differential transistor pair, operable to reduce an amount of the current flowing through the third differential transistor pair.

7. The active mixer of claim 6, wherein the working voltages of the second and third current sources are lower than the first and second voltages.

8. The active mixer of claim 6, wherein the first supplemental current is determined according to at least one of the voltage of the first node and the current flowing through the switching circuit while the second supplemental current is determined according to at least one of the voltage of the second node and the current flowing through the switching circuit.

9. The active mixer of claim 6, wherein the first supplemental current, the second supplemental current, the current of the second current source and the current of the third current source are dependent on each other.

10. The active mixer of claim 1, wherein the voltage-to-current converting circuit includes:
a first differential transistor pair including a first transistor and a second transistor in which the first transistor is operable to generate a first-phase signal of the conversion signal according to the input signal while the second transistor is operable to generate a second-phase signal of the conversion signal according to the input signal; and
at least one first current source, coupled between the first differential transistor pair and a grounding end, operable to determine the amount of the current flowing through the first differential transistor pair.

11. The active mixer of claim 10, wherein the switching circuit includes:
a second differential transistor pair, coupled with the first and second supplement current sources, the first and second output nodes and the first transistor, operable to carry out the switching action according to the clock signal;
a third differential transistor pair, coupled with the first and second supplement current sources, the first and second output nodes and the second transistor, operable to carry out the switching action according to the clock signal;
a second current source, coupled with the first and second differential transistor pairs, operable to provide a part of the current flowing through the first transistor and thereby reduce the amount of the current flowing through the second differential transistor pair; and
a third current source, coupled with the second and third differential transistor pairs, operable to provide a part of the current flowing through the second transistor and thereby reduce the amount of the current flowing through the third differential transistor pair.

12. The active mixer of claim 11, wherein the second current source is coupled between a third voltage and the first transistor during operation, the third current source is coupled between a fourth voltage and the second transistor during operation, and the third and fourth voltages are lower than the working voltages of the first and second supplement current sources.

13. The active mixer of claim 11, wherein the first supplemental current is determined according to at least one of the voltage of the first node and the current flowing through the switching circuit while the second supplemental current is determined according to at least one of the voltage of the second node and the current flowing through the switching circuit.

14. The active mixer of claim 11, wherein the first supplemental current, the second supplemental current, the current of the second current source and the current of the third current source are dependent on each other.

15. An active mixing method executed by an active mixer including a voltage-to-current converting circuit, a switching circuit and a load circuit, comprising:
generating a conversion signal according to an input signal by the voltage-to-current converting circuit;
carrying out a switching action according to a clock signal by the switching circuit and thereby electrically connecting the voltage-to-current converting circuit with the load circuit through the switching action;
providing an output signal for a first output node and a second output node located between the switching circuit and the load circuit according to the conversion signal through the switching action;
supplying a first supplemental current to the switching circuit coupled between a first voltage and a first node which is located between the first output node and the switching circuit; and
supplying a second supplemental current to the switching circuit coupled between a second voltage and a second node which is located between the second output node and the switching circuit,
in which both the first and second voltages are higher than a working voltage of the load circuit.

16. The active mixing method of claim 15, wherein the step of providing the output signal includes: generating the output signal according to the working voltage of the load circuit; the step of providing the first supplemental current includes: generating the first supplemental current according to the first voltage; the step of providing the second supplemental current includes: generating the second supplemental current according to the second voltage.

17. The active mixing method of claim 16, wherein the first and second voltages are equivalent while the first and second supplemental currents are equivalent.

18. The active mixing method of claim 16, wherein both the first and second voltages are higher than or equivalent to the sum of the working voltage and a threshold voltage of the switching circuit under a transistor saturation mode.

19. The active mixing method of claim 15, wherein the first supplemental current is determined according to at least one of the voltage of the first node and the current flowing through the switching circuit while the second supplemental current is determined according to at least one of the voltage of the second node and the current flowing through the switching circuit.

20. The active mixing method of claim 15, further comprising:

providing a second current and a third current for the voltage-to-current converting circuit and thereby reducing the amount of the current flowing through the switching circuit, wherein the first supplemental current, the second supplemental current, the second current and the third current are dependent on each other.

* * * * *